United States Patent
Salvatge et al.

(10) Patent No.: US 9,804,217 B2
(45) Date of Patent: Oct. 31, 2017

(54) EMC TEST BENCH COMPRISING AN ITEM OF EQUIPMENT UNDER TEST WHICH IS INTENDED TO BE LOADED ON BOARD AN AIRCRAFT

(71) Applicant: SNECMA, Paris (FR)

(72) Inventors: Rémy Salvatge, Melun (FR); Cyril Lair, Pontault-Combault (FR)

(73) Assignee: SNECMA, Paris (FR)

( * ) Notice: Subject to any disclaimer, the term of this patent is extended or adjusted under 35 U.S.C. 154(b) by 0 days.

(21) Appl. No.: 14/786,794

(22) PCT Filed: Apr. 25, 2014

(86) PCT No.: PCT/FR2014/051004
§ 371 (c)(1),
(2) Date: Oct. 23, 2015

(87) PCT Pub. No.: WO2014/174224
PCT Pub. Date: Oct. 30, 2014

(65) Prior Publication Data
US 2016/0103168 A1  Apr. 14, 2016

(30) Foreign Application Priority Data
Apr. 26, 2013 (FR) .................................... 13 53850

(51) Int. Cl.
*G01R 31/02* (2006.01)
*G01R 31/00* (2006.01)
(Continued)

(52) U.S. Cl.
CPC ......... *G01R 31/002* (2013.01); *G01R 31/008* (2013.01); *H04B 10/2503* (2013.01);
(Continued)

(58) Field of Classification Search
CPC .. G01R 31/005; G01R 31/006; G01R 31/008; G01R 29/0814; G01R 29/0842;
(Continued)

(56) References Cited

U.S. PATENT DOCUMENTS 5,689,192 A * 11/1997 Rogers ................. G01R 31/001
324/602
2007/0014577 A1* 1/2007 Austerlitz .......... H04B 10/2503
398/140
(Continued)

OTHER PUBLICATIONS

I.P. MacDiarmid, Proposed Developments in E.M.C. Design and Testing as a Result of the Use of Modular Avionics (IEEE 1996).*
(Continued)

*Primary Examiner* — Tung X Nguyen
*Assistant Examiner* — Robert P Alejnikov, Jr.
(74) *Attorney, Agent, or Firm* — Pillsbury Winthrop Shaw Pittman LLP

(57) ABSTRACT

An EMC test bench, includes an item of equipment under test to be loaded on board an aircraft, the item of equipment being subjected to EMC tests and delivering ARINC electrical interfaces as inputs and as output; an electrical interfaces device representative of an item of anti-lightning equipment and including an ARINC signals acquisition and/or generation card connected to the ARINC inputs and outputs of the item of equipment under test; a command and control rack for analyzing control signals originating from the electrical interfaces device including the ARINC signals acquisition and/or generation card, and a signals conversion system for protecting the command and control rack connected between the command and control rack and the electrical interfaces device.

10 Claims, 3 Drawing Sheets

(51) Int. Cl.
*H04B 10/25* (2013.01)
*H04B 10/40* (2013.01)
*H04B 10/80* (2013.01)
*H04Q 11/00* (2006.01)

(52) U.S. Cl.
CPC ............ *H04B 10/40* (2013.01); *H04B 10/802* (2013.01); *H04Q 11/0005* (2013.01); *H04Q 2011/0039* (2013.01); *H04Q 2011/0041* (2013.01); *H04Q 2011/0083* (2013.01)

(58) Field of Classification Search
CPC .......... G01R 31/2642; G01R 31/31924; H04B 10/073; H04B 10/075; H04B 10/077; H04J 14/0272; H04J 14/0273; H04J 14/0275; H04J 14/0276
USPC ................. 324/503, 72, 750.01; 398/16
See application file for complete search history.

(56) References Cited

U.S. PATENT DOCUMENTS

2011/0243566 A1* 10/2011 Truong .................. H04B 10/40
398/116

2012/0323409 A1* 12/2012 Wellbrook .......... G06F 13/4072
701/3

OTHER PUBLICATIONS

International Preliminary Report on Patentability and the Written Opinion of the International Searching Authority as issued in International Patent Application No. PCT/FR2014/051004, dated Oct. 27, 2015.
International Search Report as issued in International Patent Application No. PCT/FR2014/051004, dated Aug. 12, 2014.
MacDiarmid, I.P., "Proposed Developments in E.M.C. Design and Testing as a Result of the Use of Modular Avionics," Nov. 1996, XP 006509377, pp. 7/1-7/7.
He, T., et al., "Investigation of Test Methods for DO-160 Qualification Tests," IEEE Symposium on Electromagnetic Compatibility, 2003, vol. 1, XP010660718, pp. 120-123.
Perez-Mato, J., et al., "Experimental Approach to an Optical Wireless Interface for an Avionics Data Bus," Digital Avionics Systems Conference (DASC), Oct. 2012, XP032279793, pp. 7E4-1-7E4-10.
Beranek, M., et al., "Military and Aerospace Standards for Digital Avionics Fiber Optic Systems," Digital Avionics Systems Conference (DASC), Oct. 2011, XP032069415, pp. 7B2-1-7B2-12.

* cited by examiner

EMC TEST BENCH COMPRISING AN ITEM OF EQUIPMENT UNDER TEST WHICH IS INTENDED TO BE LOADED ON BOARD AN AIRCRAFT

CROSS-REFERENCE TO RELATED APPLICATIONS

This is the U.S. National Stage of PCT/FR2014/051004, filed Apr. 25, 2014, which in turn claims priority to French Patent Application No. 1353850, filed Apr. 26, 2013, the entire contents of all applications are incorporated herein by reference in their entireties.

FIELD

The present invention relates to the technical field of systems for assuring electrical immunity of EMC test benches while maintaining the representativeness of the tests carried out. More particularly, the field of the invention relates to devices for isolating links particularly ARINC interfaces in such test benches. As understood by the skilled artisan, ARINC is a company that sets standards for commercial aviation radio communications, and ARINC interfaces are those interfaces used under those standards. Finally, the field relates to systems that make it possible to assure a protection of test benches vis-à-vis perturbations and deteriorations caused during lightning resistance EMC tests, known as "lightning injection" tests.

STATE OF THE PRIOR ART

Test benches exist that make it possible to carry out EMC tests, particularly so-called "lightning" tests making it possible to test the resistance of electrical components to lightning.

EMC test benches generally comprise a command/control rack which makes it possible to manage the tests and to process data, to carry out measurements thereof and to control certain operating indicators. There is generally an electronic system to test and a physical interface simulator making it possible to reproduce an operational configuration between the system under test and its environment.

Furthermore, ARINC links are very widespread in items of electronic equipment intended to be loaded on board aircraft. They define in particular communication standards which are implemented for the control of items of equipment and to assure the transfer of data between said items of equipment.

One of the drawbacks of existing solutions is that they do not make it possible to assure the immunity of the command/control rack to a lightning injection on items of equipment. In fact, the ARINC429 which makes it possible to establish the link between the command/control rack and the item of equipment tested requires an electrical interface and a protocol to convey digital data which are capable of being perturbed by such a lightning injection test. ARINC429 is a data transfer standard for aircraft atomics.

It is then difficult to assure the isolation of the links ending up in the command/control rack. Despite the interface protections which may be put in place, the links are capable of being perturbed by the effects of lightning injections and may lead to a deterioration or to perturbations of the command/control rack.

One of the problems of intermediate anti-lightning protections, which can be put in place upstream of the command/control rack, is that they can influence the measurements.

In fact, additional protections and filters may be added to assure that the command/control rack is not affected. But they tend to make the test unrepresentative of the operational context of the aircraft.

It is thus difficult to assure on the one hand the immunity and the integrity of the command/control rack and on the other hand to assure good representativeness of the tests and the electrical interfaces reflecting an operational context.

An isolation of the command/control rack may be carried out, on the other hand this action does not make it possible to preserve the acquisition cards of the ARINC lines, for example, from voltage surges generated by the lightning injection tests.

SUMMARY OF THE INVENTION

The invention makes it possible to resolve the aforementioned drawbacks.

A subject matter of the invention relates to a device for converting an ARINC electrical signal into a TTL optical signal comprising an input connector capable of receiving a first ARINC signal and delivering it into a first channel, characterised in that the first channel comprises:
- a first converter of the first ARINC signal received into a first TTL electrical signal;
- a second converter of the previously converted first TTL electrical signal 3 into a first TTL optical signal;
- a component for transmitting the previously converted first TTL optical signal to an optical connector connected to an optical fibre making it possible to route said first TTL optical signal to a control item of equipment.

Advantageously, the optical connector is capable of receiving a second TTL optical signal and delivering it to a second channel of the converter device, the latter comprising:
- a component for acquiring the second TTL optical signal originating from the optical connector;
- a third converter of the second TTL optical signal received into a second TTL electrical signal;
- a fourth converter of the previously converted second TTL electrical signal into a second ARINC signal.

Advantageously, the converter device further comprises a supply delivering to the first channel and to the second channel a direct voltage supply.

An advantage of a converter device comprising two channels is that it enables it to be used for the conversion of electrical signals into optical signals and vice versa. An advantage is to make it possible to construct an immune link when two converter devices are placed opposite at the level of the inputs/outputs of two items of electronic equipment.

Another aspect of the invention relates to a signals conversion system, for protecting a control rack, comprising:
- a first converter device according to the invention;
- a second converter device according to the invention;
- at least one optical fibre making it possible to route optical signals from the first to the second converter and/or vice versa.

The signals conversion system is then on the one hand connected to a command/control rack and on the other hand connected to an electronic device comprising an ARINC signals acquisition and/or generation card.

Another aspect of the invention relates to an EMC test bench, comprising:
- an item of equipment under test intended to be loaded on board an aircraft, said item of equipment being subjected to EMC tests and delivering ARINC electrical interfaces as inputs and as output;

an electrical interfaces device representative of an item of anti-lightning equipment and comprising an ARINC signals acquisition and/or generation card connected to the ARINC inputs and outputs of the item of equipment under test;

a command/control rack for the analysis of control signals originating from the electrical interfaces device comprising an ARINC signals acquisition and/or generation card;

a signals conversion system for protecting the command/control rack connected between said command/control rack and the electrical interfaces device.

Advantageously the electrical interfaces device comprises:

a lightning protection making it possible to limit the maximum common mode voltage to 20 VDC;

an input impedance suited to the first converter device.

Advantageously, electrical controls generated from the command/control rack are converted by the second converter device into optical signals and delivered by means of an optical fibre to the first converter device delivering to the electrical interfaces device signals converted to ARINC electrical formats.

Advantageously, the item of equipment under test is a regulation system.

An advantage of the solution of the invention is to provide an immunity of the bench with respect to lightning tests and to make it possible at the same time to assure the test represents the actual electrical interface.

Advantageously, the first signal and the second ARINC signal are ARINC429 signals and the ARINC electrical interfaces of the item of equipment under test are suited to the transmission/reception of ARINC429 signals.

BRIEF DESCRIPTION OF THE FIGURES

Other characteristics and advantages of the invention will become clearer on reading the detailed description that follows, with reference to the appended figures, which illustrate.

DESCRIPTION

"EMC test" means a compatibility test of an EMC item of equipment with an EMC environment envisaged operationally. Depending on the test plans, different types of test exist such as:

endurance and resistance tests to a given electromagnetic environment defined over a given time period;

destructive tests which aim to study the operating limits of an item of equipment at limit values;

contextual tests which can reproduce an event which could occur operationally such as lightning, etc.

The invention described hereafter is especially appropriate for protecting test means such as a command/control rack to so-called lightning injection tests.

Command/control racks comprise, depending on the case: data acquisition cards, an electrical console, a memory for saving data received, a PC or a computing unit making it possible to carry out operations on the data received.

Figure 1:
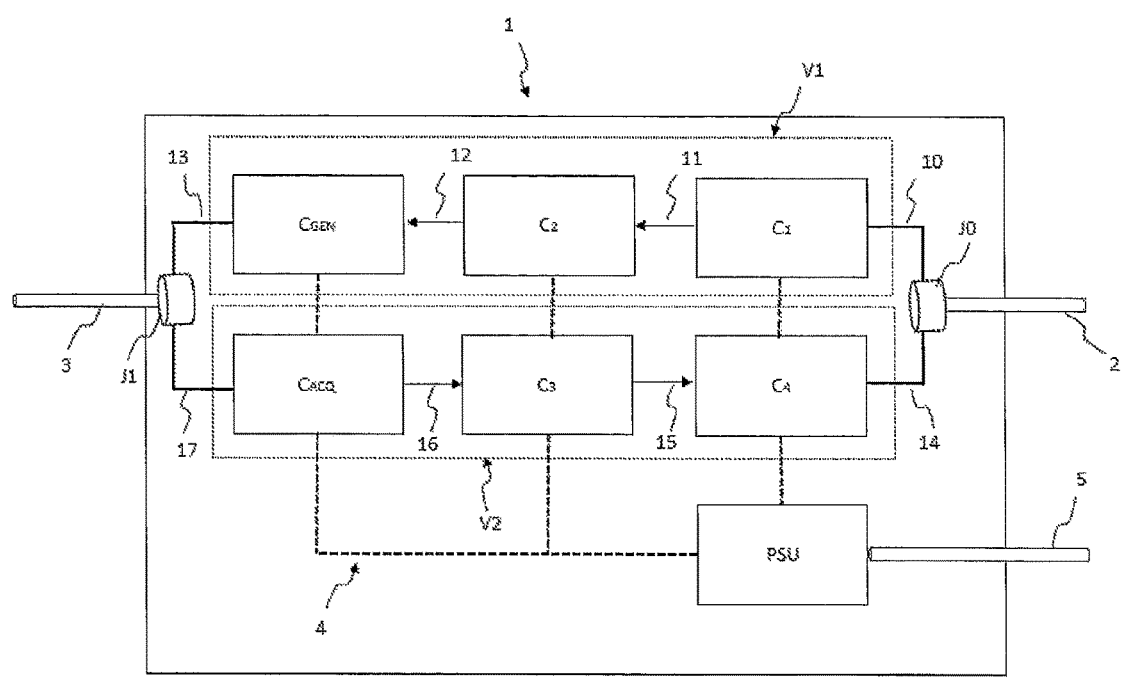
FIG. 1: a device for converting ARINC signals into optical signals and vice versa.

FIG. 1 represents an embodiment of the invention in which a converter 1 of ARINC electrical signals into optical signals and vice versa makes it possible to keep the command/control rack immune from so-called lightning injection tests. The command/control rack is noted CCR in FIG. 2.

The converter 1 comprises two channels V1, V2 making it possible to assure respectively on the one hand the conversion of electrical signals into optical signals and on the other hand the conversion of optical signals into electrical signals.

A strand 2 makes it possible to route ARINC links originating from an electrical interfaces device, noted EID, connected to a system under test, noted SRT. The ARINC signals are then routed to a first converter C1 via a connector $J_0$. The signals are routed by means of a link 10 comprising two filaments. The connection may be made through the intermediary of a shielded twisted pair composed of two filaments, also called lines. The transfer of data is realised differentially between the two lines of the pair.

The signals originating from the ARINC electrical interfaces device are transferred according to the norm ARINC429 and have a trapezoidal form. The first converter C1 makes it possible to convert the ARINC electrical signals 429 into TTL electrical signals. A TTL signal is defined by a first low logic level between 0 and 0.5 V and a second high logic level between 2.4 V and 5 V. According to variants, these levels vary slightly between the different series. The TTL electrical signal has a slotted shape.

The TTL signal converted by the first converter C1 is transmitted via a link 11 to a second converter C2.

The second converter C2 makes it possible to convert a TTL electrical signal into a TTL optical signal. The optical signal is then transmitted via an optical link 12 to a component $C_{GEN}$ making it possible to generate on an optical fibre 13 the optical signal to the command/control rack CCR.

A strand 3 makes it possible to route the transiting data on the optical link 13 to the command/control rack CCR.

The conversion of the electrical signals into optical signals makes it possible to assure a so-called "optical" isolation of the command/control rack CCR.

The converter 1 comprises a second channel V2 making it possible to convert the optical signals received from the command/control rack CCR and to transform them into electrical signals. The signals originating from the strand 3 are routed via the connector $J_1$ and via the optical link 17 to an acquisition card $C_{ACQ}$ of the optical signals. The optical link 17 may be an optical fibre. They are then routed via a link 16 to a third converter C3 to convert the TTL optical signals into TTL electrical signals. The TTL electrical signals are then routed via the link 15 to a fourth converter C4 for a conversion according to the electrical norm ARINC, particularly into ARINC signals 429 in this example. The ARINC429 signals are routed via the link 14 at the output of the converter C4 into a strand 2 to be processed by the electrical interfaces device EID.

The signals which are transferred from the command/control rack to the electrical interfaces device make it possible for example to manage the SRT or to send controls or configurations making it possible to perform a series of EMC tests according to different configurations. Moreover, the EID may be supplied by the command/control rack.

The signals which are transferred from the electrical interfaces device to the command/control rack make it possible for example to highlight the variations of electrical states of the item of equipment under test SRT, to study the responses to the injected EMC perturbations, to detect behaviours at the limits of said item of equipment under test in order to certify an item of equipment for its operational production.

The different components of the converter 1 such as the converters C1, C2, C3, C4 and the signal acquisition components, such as $C_{ACQ}$ and the components generating the signals on the lines $C_{GEN}$ are supplied by an external supply, noted PSU. The PSU supply may be integrated in the converter 1. The PSU supply makes it possible to deliver, from a distribution 4 of supply links, direct voltages to the different components of the converter 1. The direct voltages delivered may be for example 12V or 24V.

The PSU supply is itself supplied by an external 220V or 110V supply via a supply link 5.

Figure 2:
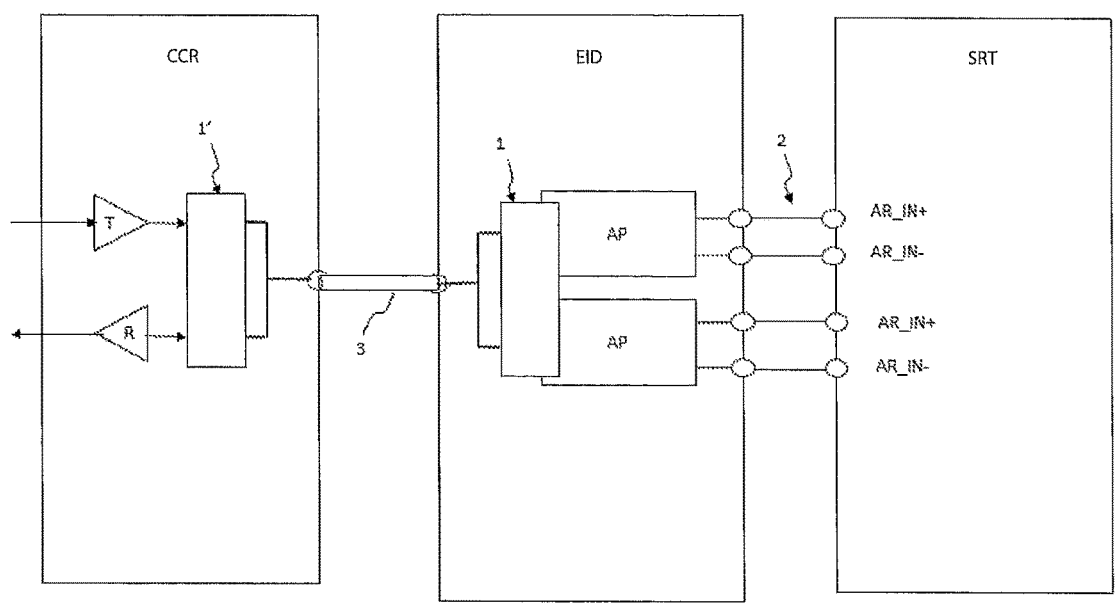
FIG. 2: an EMC test system of an item of equipment under test comprising an optical-electrical signals conversion system.

FIG. 2 represents the EMC test bench as well as its interfaces, particularly ARINC and optical. It comprises a command/control rack CCR, an electrical interfaces device EID and an item of equipment under EMC test noted SRT system. The item of equipment under EMC test is a regulation system noted SRT. The converter 1 previously described through FIG. 1 is here represented by block 1 of FIG. 2.

The SRT system under EMC test is called upon so as to enable a control of its operating evolution by the command/control rack CCR. A lightning injection test consists in injecting into the SRT system strong electrical discharges and studying the evolution of the electrical behaviour of the system under test.

The command/control rack CCR enables:
  the acquisition, the processing and the recording of data in the form of electrical signals, particularly those that are measured or monitored by the test bench;
  the control of all the adjustment parameters of the EMC test bench.

The electrical interfaces device EID makes it possible to faithfully reproduce the operational context so as to assure a representativeness of the EMC tests, especially in terms of electrical interfaces. It comprises modules, noted AP designating "airplane protection", making it possible to offer the item of equipment under test SRT interfaces identical to those of the operational context which correspond for example to the airplane protection module of the anti-lightning protection type.

The electrical interfaces device EID further makes it possible to implement lightning protection solutions.

FIG. 2 represents the command/control rack CCR comprising a block 1'. The block 1' comprises a converter as described in FIG. 1. The converter 1' is on the other hand placed opposite the converter 1 such that it converts the optical signals originating from the strand 3 into electrical signals. The TTL optical signals are then successively converted into TTL electrical signals and into ARINC429 signals.

The implementation of two optical/electrical converters between the electrical interfaces device and the command/control rack makes it possible to immunise the rack from potential deteriorations and perturbations caused for example by the generation of voltage surges.

Hence, the command/control rack is thus protected from electrical voltage surges thanks to the converters C1 and C2 which enable the optical passage of data from the electrical interfaces device EID to the rack.

The conversion of the signals to optical format avoids propagating any potential voltage surge to the acquisition cards of the command/control rack CCR. The ARINC acquisition cards of the command/control rack are thus protected from deteriorations which could occur caused by one/several voltage surge(s) or inappropriate behaviours such as for example the spontaneous stoppage of the rack.

Furthermore, the optical fibres are, by definition, incapable of radiating and thus, through crosstalk, perturbing other electrical signals acquired by the bench at the level of the command/control rack CCR.

The type of optical signal: "optical TTL" is a signal format making it possible to re-transcribe faithfully the data transmitted while assuring an immunity of the command/control rack and acquisition cards.

In order to assure the electrical representativeness of the interface, the first optical conversion stage may be configured so as to have an input impedance equivalent to that of an ARINC receiver and conversely an output impedance for an ARINC transmitter.

The optical link makes it possible to avoid the propagation of electrical perturbations to the command/control rack and thus assure a reduction of cases of breakdowns or deterioration of the items of equipment of the rack.

One of the advantages of the double stage of conversion of signals of the invention is that it is suited to the particular form of the ARINC signal. In particular, the rises and descents of the signal have to be made in very precise times, the signal has a positive and negative alternation and makes a direct electrical/optical conversion difficult.

A first conversion of the ARINC signal into a TTL electrical signal makes it possible to assure an input impedance equivalent to an ARINC receiver. This TTL electrical signal is then converted into a TTL optical signal for example by means of an optocoupler, also called photocoupler.

In reception, the optical signal is translated into a TTL electrical signal 20 then into an equivalent ARINC electrical signal.

One of the advantages of the converter device of the invention is that the conversion of the signals makes it possible to harmonise all the TTL optical isolations of the test bench and thus to meet a requirement of representativeness of the operational mode.

The optical isolation of the transmitted signals makes it possible to connect sub-assemblies together without causing deteriorations during the implementation of lightning injection tests. Thus the converter device comprising a first converter, an optical strand and a second converter may be used so as to be interposed between two items of equipment having ARINC interfaces.

Thus the converter device may be used as electromagnetic insulator of transmissions between two items of equipment.

The converters and receivers are thus identical on either side of the electrical interfaces device EID and the command/control rack CCR.

The solution of the invention makes it possible to limit the number of different items of equipment in the test bench. Moreover, the interfaces are easy to replace in the event of deterioration.

Figure 3:
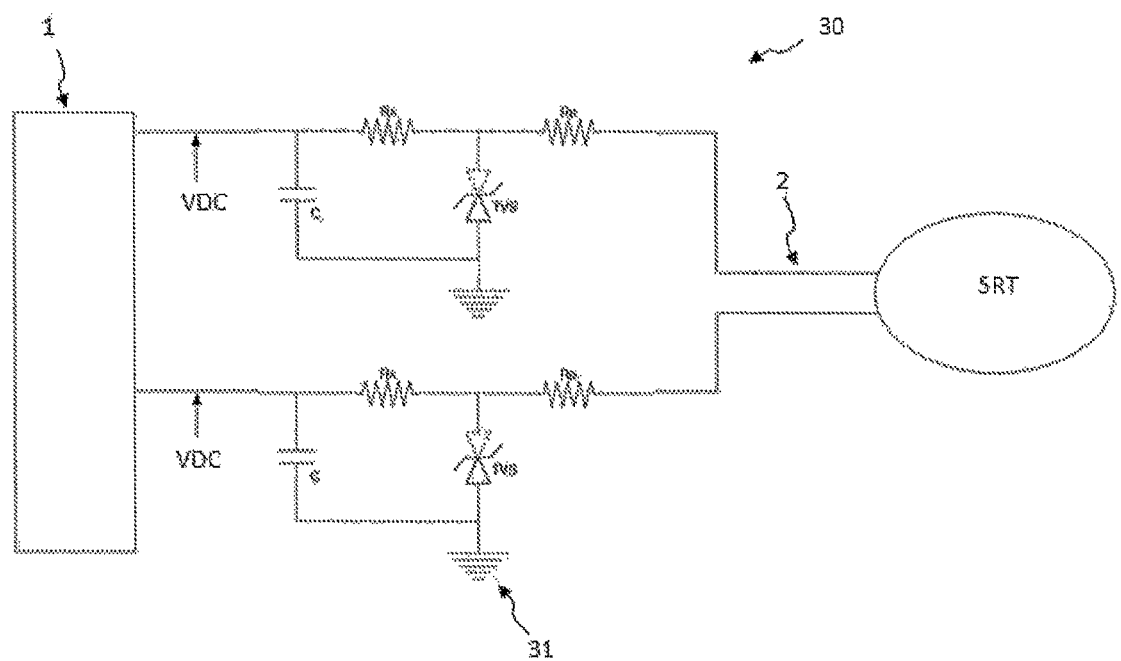
FIG. 3: an electrical circuit assuring an anti-lightning protection of ARINC signals connected to a converter device of the invention.

FIG. 3 represents an embodiment of the interface between an AP module noted 30 of the electrical interfaces device EID and the signals converter 1.

The condition for proper functioning of this solution is to assure that the electronic circuit withstands the residual common mode voltage after the airplane protection. Obviously this depends on the protection implemented 31, and thus on the airplane since this is identical to the airplane protection. The residual voltage is transient with a maximum voltage level of 11 VDC.

This voltage corresponds to the clamping voltage of the TVS diode, the acronym of which designates the terms: "Transient Voltage Suppression". The TVS diode is represented in FIG. 3 in the stage 31 corresponding to the "lightning protection" function.

In order to have a proper functioning margin, the isolation circuit is designed for a maximum common mode, voltage of 20 VDC.

The invention claimed is:

1. An electromagnetic compatibility (EMC) test bench, comprising:
   an item of equipment under test to be loaded on board an aircraft, said item of equipment being subjected to EMC tests and delivering ARINC electrical interfaces as inputs and as output;
   an electrical interfaces device representative of an item of anti-lightning equipment and comprising an ARINC signals acquisition and/or generation card connected to the ARINC inputs and outputs of the item of equipment under test;
   a command and control rack for analyzing control signals originating from the electrical interfaces device comprising the ARINC signals acquisition and/or generation card, and
   a signals conversion system for protecting the command and control rack configured to convert an ARINC electrical signal into an optical signal and vice versa, said signals conversion system being connected between said command and control rack and the electrical interfaces device.

2. The EMC test bench according to claim 1, wherein the electrical interfaces device comprises:
   a lightning protection making it possible to limit a maximum common mode voltage to 20 VDC;
   an input impedance suited to the first converter device.

3. The EMC test bench according to claim 1, wherein the signals conversion system for protecting the command and control rack comprises:
   a first converter device for converting an ARINC electrical signal into a TTL optical signal and/or vice versa;
   a second converter device for converting an ARINC electrical signal into a TTL optical signal and/or vice versa;
   at least one optical fibre making it possible to route optical signals from the first to the second converter device and/or vice versa,
   said signals conversion system being on the one hand connected to the command and control rack and on the other hand to the item of equipment under test, the latter comprising an ARINC signals acquisition and/or generation card.

4. The EMC test bench according to claim 3, wherein:
   the electrical interfaces device comprises the first converter device;
   the command and control rack comprises the second converter device, and
   the optical fibre connects the electrical interfaces device to the command and control rack through the intermediary of the first and the second converter devices.

5. The EMC test bench according to claim 3, wherein electrical commands generated from the command and control rack are converted by the second converter device into optical signals and are delivered by an optical fibre to the first converter device delivering to the electrical interfaces device signals converted to ARINC electrical formats.

6. The EMC test bench according to claim 1, wherein the item of equipment under test is a regulation system.

7. The EMC test bench according to claim 3, wherein each of the first and second converter devices comprises an input connector for receiving a first ARINC signal and delivering the first ARINC signal into a first channel, said first channel comprising:
   a first converter of the first ARINC signal received into a first TTL electrical signal;
   a second converter of a previously converted first TTL electrical signal into a first TTL optical signal;
   a component for transmitting the previously converted first TTL optical signal to an optical connector connected to an optical fibre making it possible to route said first TTL optical signal to a control item of equipment.

8. The EMC test bench according to claim 3, wherein each of the first and second converter devices comprises an optical connector for receiving a second TTL optical signal and delivering the second TTL optical signal into a second channel comprising:
   a component for acquiring the second TTL optical signal originating from the optical connector;
   a third converter of the second TTL optical signal received into a second TTL electrical signal;
   a fourth converter of a previously converted second TTL electrical signal into a second ARINC signal.

9. The EMC test bench according to claim 7, further comprising a supply for delivering to the first channel and to the second channel a direct voltage supply.

10. The EMC test bench according to claim 1, wherein:
    the first signal and the second ARINC signal are ARINC signals 429 and;
    the ARINC electrical interfaces of the item of equipment under test are suited to the transmission/reception of ARINC signals 429.

* * * * *